United States Patent [19]

Debord et al.

[11] 4,251,803

[45] Feb. 17, 1981

[54] DYNAMIC ZERO OFFSET COMPENSATING CIRCUIT FOR A/D CONVERTER

[75] Inventors: Pierre Debord, Vence; Jean-Louis Marijon, Le Bar-sur-Loup, both of France

[73] Assignee: International Business Machines Corporation, Armonk, N.Y.

[21] Appl. No.: 912,123

[22] Filed: Jun. 2, 1978

[30] Foreign Application Priority Data

Jun. 30, 1977 [FR] France .............................. 77 207307

[51] Int. Cl.² ............................................. H03K 13/02
[52] U.S. Cl. ....................... 340/347 CC; 340/347 AD
[58] Field of Search .... 340/347 M, 347 CC, 347 DA; 325/38 B; 328/162, 165; 324/130

[56] References Cited

U.S. PATENT DOCUMENTS

| | | | |
|---|---|---|---|
| 3,105,230 | 9/1963 | MacIntyre | 340/347 CC |
| 3,582,784 | 6/1971 | Gaunt | 325/38 B |
| 3,746,990 | 7/1973 | Le Diberder | 325/38 B |
| 3,761,841 | 9/1973 | Jacquart | 325/38 B |
| 3,893,103 | 7/1975 | Prill | 340/347 CC |
| 3,953,805 | 4/1976 | Couvillon | 340/347 CC |
| 4,034,366 | 7/1977 | Memishian | 340/347 DA |

FOREIGN PATENT DOCUMENTS

1113700  5/1968  United Kingdom .

Primary Examiner—Charles D. Miller
Attorney, Agent, or Firm—Edward H. Duffield

[57] ABSTRACT

Disclosed is a dynamic compensation circuit for correcting the residual offset voltage encountered in an analog-to-digital conversion chain. Samples of an analog signal having an average value equal to 0 are provided to a first input of a comparator, the second input of which receives a reference signal generated through a D to A converter under control of a control logic circuit. A sample and hold circuit with the comparator causes a DC offset of the output signal level which is to be dynamically corrected by the compensating circuit of the invention. The DC offset causes the duty cycle to differ from one by an amount ΔDC which will be the error curve signal of the compensation circuit. The compensating circuit reduces the ΔDC to 0 by adding to the signal a DC voltage opposite to and of equal magnitude to the offset voltage level.

8 Claims, 10 Drawing Figures

DYNAMIC ZERO OFFSET COMPENSATING CIRCUIT FOR A/D CONVERTER

TECHNICAL FIELD

This invention concerns a circuit for dynamically compensating for the zero level offsets introduced into an output signal when processed by analog devices such as amplifiers, comparators and the like, or combinations thereof. It more particularly concerns such a circuit for correcting the zero level offsets in devices which give information about the sign of the output signal. Therefore, the circuit of this invention is particularly intended to correct the zero level offset introduced into the output signal through a conversion chain for converting an analog input signal into a digital output signal.

BACKGROUND ART

As a rule, the devices which perform operations upon analog signals such as, for instance, amplifiers, comparators, etc., add a DC voltage component to the signal under process, thereby bringing about a zero level offset. This offset is often the source of errors. Such errors are all the more important in effect when the signal level is low. In addition, when the signal has to be processed throughout an assembly of devices, which is the case when an analog signal is to be converted into a digital signal in a conversion chain, each device introduces a zero level offset which results in an important global error. The value of the output signal of the assembly in such instances does not have the desired relationship with the input signal.

A conventional analog to digital conversion chain is comprised of a plurality of devices. A sample and hold device takes samples of the signal to be converted and stores their values throughout the conversion time period. A comparator receives the value of the stored sample at one input and successively receives reference levels with which the value stored during the conversion time period is compared at the other input. These reference levels can be generated in different ways. They can, for instance, be provided by a digital-analag converter (DAC) under the control of a logic circuit which, according to the result of the comparison, causes the bit pattern converted by the DAC to be varied in order to obtain either a higher or lower reference level. Such a conversion chain is well known in the prior art and is disclosed in the book entitled "Analog to Digital/Digital to Analog Conversion Techniques" by David F. Hoeschle, Jr., issued by John Wiley and Sons, Inc., page 360.

Each of the devices in the conversion chain, namely the sample-hold device, the comparator and the reference level generator, introduces a zero level offset and, therefore, the digitally-coded signal does not correspond exactly to the analog input value.

A solution to this problem consists in making a zero measurement periodically which gives the offset value introduced by the conversion chain. This measurement is made by applying a zero level signal to the input of the conversion chain and coding it. The coded value is the zero offset measurement utilized to make the correction. This value, therefore, must be subtracted from the output signal. This solution has two drawbacks. First, it is not possible to make a dynamic correction of the zero offset. In addition, time must be allowed for the zero measurement, thereby decreasing the conversion rate.

OBJECTS OF THE INVENTION

Therefore, one object of this invention is to provide an improved circuit for a correction device for dynamically correcting zero offsets introduced into a signal when processed by an analog device.

Another object of this invention is to provide an improved correction device particularly well adapted to making the zero offset correction in an analog-digital conversion chain.

BRIEF SUMMARY OF INVENTION

The circuit according to this invention is intended to compensate for the zero offsets introduced into the output signal of analog to digital converters by the analog device. To this end, it generates a compensation signal which is applied to the input of the analog device. For instance, if the compensation circuit is involved in the correction of the zero offset in a comparator comparing an input signal level with respect to ground, the compensation circuit generates a compensation signal voltage V which is applied to the comparator input that is normally grounded when there is no compensation. When the compensation circuit is involved in the correction of the offset introduced by an amplifier, the compensation signal is added or subtracted according to the offset direction of the signal to be amplified.

The analog devices, as a rule, process signals having no DC component and a zero mean value.

When applying a sinusoidal signal well-centered around zero to an analog device of such a type, time T+ during which the signal is positive is equal to time T− during which the output signal is negative when no zero offset is introduced by the device. On the other hand, when a zero offset occurs, times T+ and T− are different and the offset is proportional to the difference between times T+ and T−.

Therefore, and in conformity with a first embodiment of this invention, the compensation circuit for compensating for the zero offset generates a compensation signal, the mean value of which is proportional to the difference between times T+ and T−.

This circuit is comprised of two current sources S1 and S2 which supply currents of opposite direction −I and +I, respectively. These two sources are series-connected and their common point M is connected to a capacitor of value C. Each source is switched on or off, in turn, depending on the sign of the output signal. Should the sign be positive, source S1 is switched on; should the sign be negative, source S2 is switched on. Therefore, when the two current sources are balanced, the voltage at point M is a sawtooth voltage with a zero mean value when there is no zero offset. On the other hand, should a zero offset V occur, one of the sources is switched on for a while longer than the other so that the voltage at point M has no more a zero mean value. The potential difference V between the beginning and the end of a duty cycle is equal to $(T_- - T_+) I/C$, at the terminals of the capacitor. Voltage at point M is utilized as the offset compensating voltage.

According to another embodiment of this invention, the two current sources are not switched on for the duration of the time-lengths when the output signal is positive or negative, but only during times $t_+$ and $t_-$ defined such as follows: $t_-$ is representative of the time-length between the offset zero crossing and the real zero crossing of the output signal, in the positive direction, in the case of a negative offset, and $t_+$ is representative of the time-length between the real zero crossing and the offset zero crossing of the output signal, in the positive direction, in the case of a positive offset. Sources S1 and S2 respectively are switched on during times $t_+$ and $t_-$, respectively. In this specific embodiment, the voltage at point M is no more a sawtooth voltage, and the absolute values of currents $+I$ and $-I$ can be different.

This embodiment is of particular interest when applied to the zero offset correction in a device where times $t_+$ and $t_-$ can be easily detected, such as, for instance, in an analog-digital converter.

In addition, this embodiment can be involved in the compensation for the zero offset introduced by devices processing signals having a zero mean value but wherein $T_+$ and $T_-$ can be different even when there is no zero offset.

This invention will be further disclosed by way of a non-limitative example, with reference to the accompanying drawings, in which:

DISCLOSURE OF INVENTION

Figure 1:
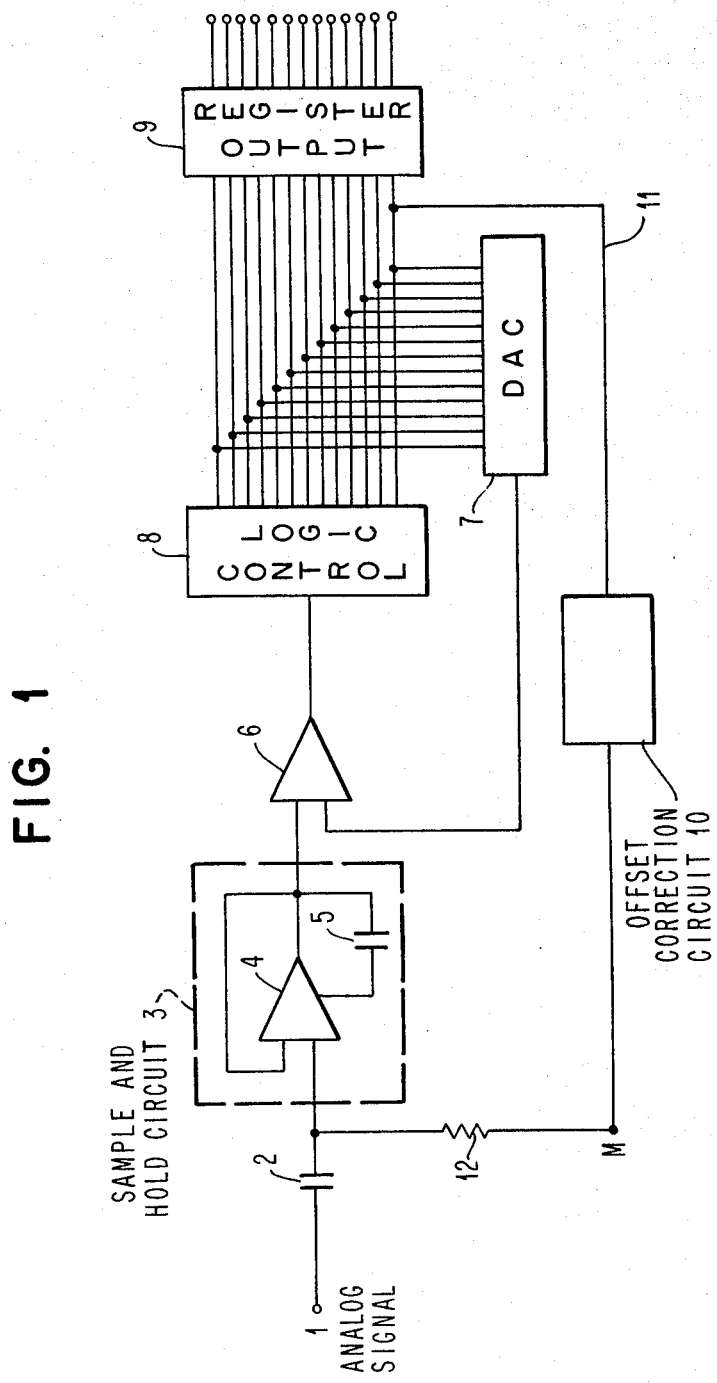
FIG. 1, is a schematic diagram of an analog-digital converter wherein a compensation circuit according to this invention has been introduced.

With reference to FIG. 1, the apparatus and method of operation of the circuit according to this invention as involved in an analog-digital converter will be discussed.

The analog signal to be converted is applied to input 1 of the converter and its DC component is removed by capacitor 2. The converter is comprised of a sample and hold circuit 3 which is schematically shown as comprising an operational amplifier 4 and a storage capacitor 5. During the sampling times, circuit 3 takes the level of the input signal and stores it during the conversion period. The output of circuit 3 is applied to one input of comparator 6, the other input of which receives a reference level generated by digital-analog converter 7, under the control of logic circuit 8. During the conversion period, $2^m$ reference levels are generated, m being representative of the number of bits in the digital output signal formed. A first digital word is converted by converter 7 and the corresponding analog value is compared with the stored level of the input analog signal. According to the result obtained from the comparison, a higher or lower reference level is generated under the control of the circuit 8 until the input signal level is equaled, and the result is then stored in the output register 9.

A converter of such a type, which is comprised of the plurality of elements 3, 6, 8, 7 introduces a zero offset, i.e., when no signal is applied to the input, the digital value stored in the output register is not zero.

Circuit 10 according to this invention is intended to correct the zero offset. This circuit which receives the information relative to the level of the output signal on line 11, generates a voltage $V_M$ at point M to which the input analog signal is referenced through resistor 12. This point M is often grounded in a conventional converter which has no compensation circuit.

The converter or belt will not be further disclosed herein since it forms no part of this invention. Its block diagram is given only by way of an example showing the implementation of the circuit according to this invention. It is, of course, obvious that this compensation circuit can be implemented to correct the zero offsets introduced by other devices involved in the processing of analog signals, such as, for instance, a comparator, an amplifier, etc.

Before disclosing the preferred embodiments of circuit 10, it will be shown, in reference to FIG. 2, how the reference level to be applied to point M is generated. In particular, the description will be for that reference level required in order to make a correction when the output signal has a zero mean value and when during a time period T, time $T_+$ during which the signal is positive is equal to time $T_-$ during which it is negative. This is often the case when the signal to be converted is a frequency or phase-modulated signal.

Figure 2A:
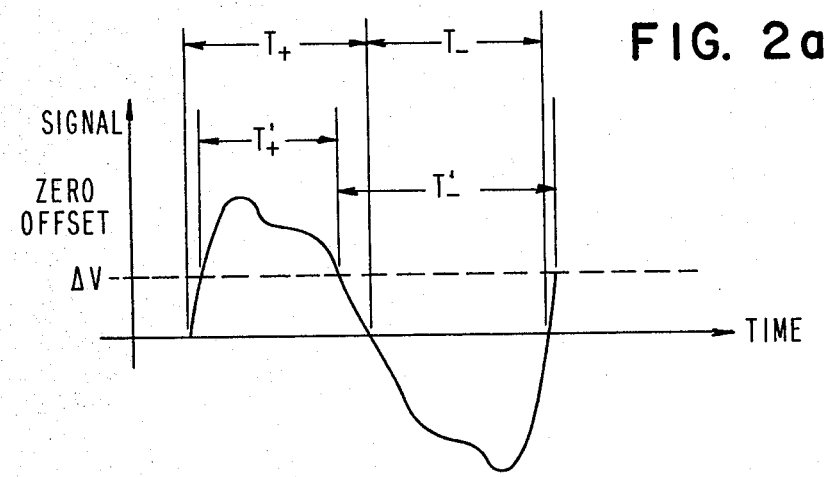
FIGS. 2a and 2b illustrate the output signal of the analog device and the voltage generated at point M.

Such a signal is shown in FIG. 2A. When the converter introduces a zero offset $\Delta V$, the output signal coded by the converter will be positive during time $T'_+$ when the input signal level is higher than $\Delta V$, and it will be negative during time $T'_-$, when the input signal level is lower than $\Delta V$. Should $\Delta V$ be equal to zero, there is obtained $T'_+ = T_+$ and $T'_- = T_-$.

The circuit according to this invention transforms difference $T'_- - T'_+$ into a reference voltage $V_M$ which is applied to point M for compensation.

Figure 2B:
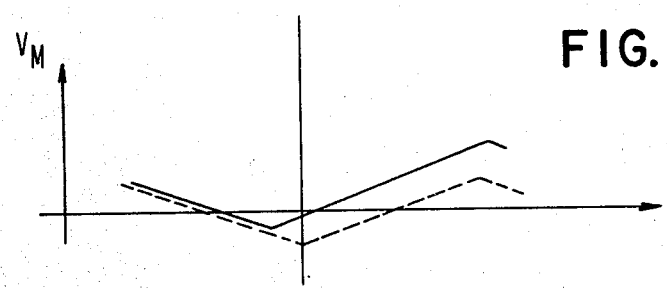

Voltage $V_M$ is shown in FIG. 2B. At balance, when there is no zero offset, it assumes the shape illustrated by the dotted line and, when there is a zero offset, it assumes the shape illustrated by the solid line for the situation shown in FIG. 2A.

Figure 3:
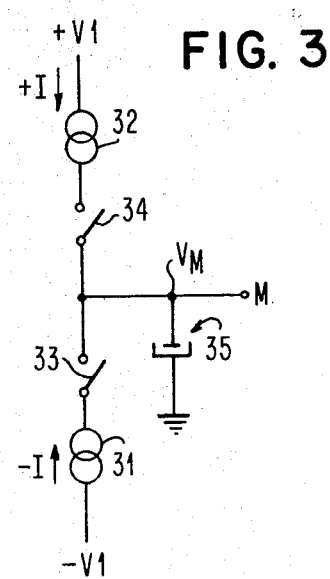
FIG. 3, is a first embodiment according to this invention.

The simplest circuit involved to implement this transformation is shown in FIG. 3.

This circuit is comprised of two current sources 31 and 32 which have been supposed to be perfectly balanced and which are connected to two bias voltages $-V1$ and $+V1$ and which supply currents $-I$ and $+I$, respectively. The two current sources are connected to common point M through two switches 33 and 34, respectively. The two switches are turned off, by turns, under the control of the sign of the output signal. Switch 34 is turned off when the sign of the output signal is negative and switch 33 is turned off when the sign is positive.

Therefore, during time period $T'_+$, the C value capacitor 35, which is connected to point M, is discharged with current $-I$ and, during time period $T'_-$, capacitor is charged with current $+I$. Then, voltage $V_M$ at the terminal of the capacitor assumes the shape shown by the solid line in FIG. 2B. Should a zero offset occur, voltage $V_M$ does not assume a zero mean value and, between the beginning and the end of the duty cycle, there is a potential difference $V_M = (IT'_{31} - IT'_+) 1/C$, C being representative of the value of the capacitance.

The voltage generated at the terminal of the capacitor is applied to point M, which is the zero offset compensating signal for the input signal.

The looped system of FIG. 1 reaches its balance when both charge and discharge of the capacitor 35 in FIG. 3 are equal; at this moment, the voltage at the capacitor terminals assumes the shape represented by the dotted line, and the output signal is centered around zero.

It is apparent that the values of currents $+I$ and $-I$ and of the capacitor must be chosen with respect to the lowest frequency of the input signal to be transmitted, the lowest level thereof and the admissible maximum offset introduced by the device for a signal of maximum level.

The circuit disclosed with reference to FIG. 3 to illustrate the principle of this invention, has a few drawbacks.

One of these drawbacks comes from the fact that two current sources are necessary, which are switched by turns. In the practice, these current sources are implemented by means of transistors, one being of the NPN type, and the other one, of the PNP type. It is well known, however, that such transistors have different switching times. It results therefrom that the times necessary to charge and discharge the capacitor are different even when there is no zero offset.

Figure 4:
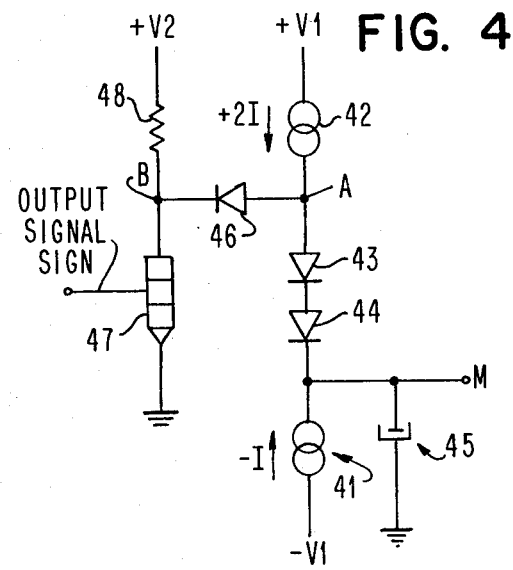
FIG. 4 is a second embodiment according to this invention.

With the circuit shown in FIG. 4, it is possible to overcome this drawback. To this end, two current sources 41 and 42 which supply currents $-I$ and $+2I$, are used, respectively. These sources are continuously operated. Source 42 is connected to bias voltage $+V1$, source 41 is connected to voltage $-V1$. The circuit includes capacitor 45 (similar to capacitor 35 shown in FIG. 3) and three diodes 43, 44 and 46 as well as a gate comprised of transistor 47 and resistor 48.

Current source 42 is connected to current source 41 through diodes 43 and 44, and anode of diode 43 being connected at point A to current source 42 and the cathode of diode 44 being connected at point M to current source 41. The anode of diode 46 is connected to point A and its cathode is connected to the collector of transistor 47, at point B. Point B is connected to bias voltage $+V2 < +V1$, through resistor 48. The emitter of transistor 47 is grounded and its base receives the information relative to the sign of the output signal.

When the sign of the output signal is negative, capacitor 45 must be charged with current $+I$. Therefore, transistor 47 is turned off. Therefore, at point B, the level is higher than that at point A and diode 46 is turned off, making diodes 43 and 44 conducting ("on" condition). Current source 42 supplies capacitor 45 with current $+2I$ and current source 41 draws current $-I$ from the capacitor 45, thus charging the capacitor with a new current I.

When the sign of the output signal is positive, transistor 47 is turned on, thereby making diode 46 conducting, and the current supplied by current source 42 is steered to the ground through the diode 46 and transistor 47. Both diodes 43 and 44 prevent the current from flowing to point M.

The circuit shown in FIG. 4 operates in the same way as the circuit shown in FIG. 3 for generating voltage $V_M$ which assumes the shape illustrated in FIG. 2B.

Figure 5:
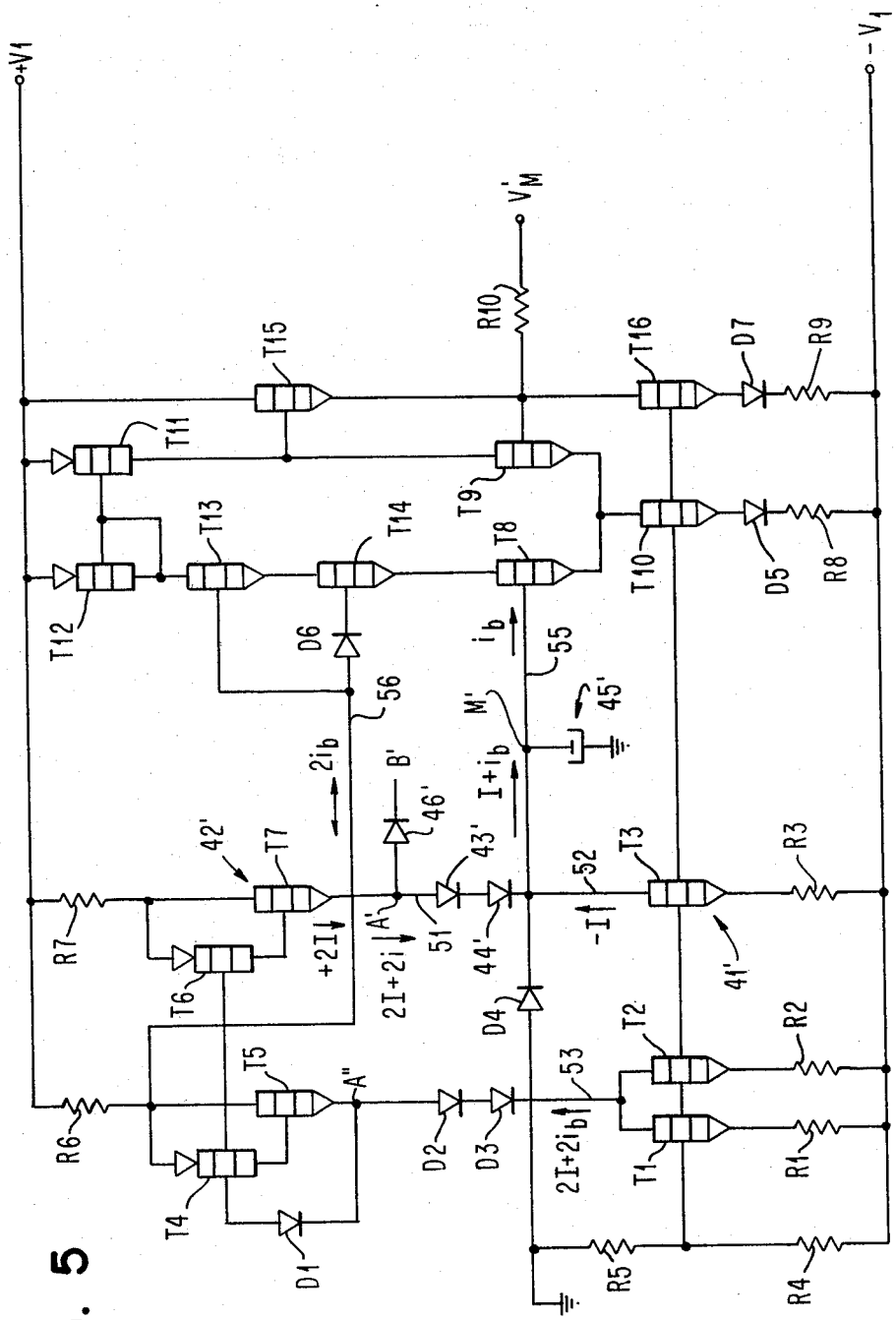
FIG. 5 shows in details a circuit according to the second embodiment of this invention.

FIG. 5 is a detailed diagram of the circuit shown in FIG. 4. The elements which are common to the circuits shown in FIGS. 4 and 5 have the same references, but in FIG. 5 they are accompanied with the prime sign.

The circuit shown in FIG. 5 is comprised of two current sources 41' and 42' which supply $+2I$ and $-I$ in leads 51 and 52, respectively. Current source 42' is series-connected with source 41' through diodes 43' and 44', as shown with respect to the circuit of FIG. 4. Capacitor 45' is connected to point M' which is the connection point of diode 44' and source 41'. Diode 46' the conducting state of which is controlled by the sign of the output signal (as disclosed in reference to FIG. 4) brings the current supplied by source 42', to ground when the sign of the output signal is positive.

In order to generate currents $+2I$ and $-I$, three transistors T1, T2 and T3 are used, which have their emitters connected to voltage $-V1$, through three resistors R1, R2, R3, respectively. The bases of T1, T2 and T3 are connected to the common point of two resistors R4 and R5 which are series-connected between ground and voltage $-V1$. The two resistors R4, R5 supply the appropriate bias voltage to the bases of transistors T1, T2, T3, respectively.

The collectors of transistors T1 and T2 are connected in common to lead 53 and the collector of transistor T3 is connected to lead 52, thereby the current in lead 53 being equal to $+2I$ and the current in lead 52 being equal to $+I$.

Diode D1, transistors T4, T5 and T6, T7 and resistors R6, R7 are a current mirror which reflects the current in lead 53 into lead 51. The arrangement of this current mirror is as follows: transistors T4, T5 are arranged into a super PNP transistor configuration, the emitter of PNP transistor T4 being connected to the collector of NPN transistor T5. The connection point of the collector and the emitter of transistors T5 and T4 is connected to bias voltage $+V1$, through resistor R6. The base of T4 is connected to the anode of diode D1, and its cathode is connected to the emitter of transistor T5.

PNP transistors T6 and NPN transistor T7 are arranged also into a super PNP transistor configuration, the base of transistor T6 being connected to the base of transistor T4. Point A' (which corresponds to point A of FIG. 4) is taken at the emitter of transistor T7. Point A" at the emitter of transistor T5 is connected to the collectors of transistors T1 and T2, through two series-connected diodes D2 and D3 so that there is the same voltage $V_{CE}$ between the collectors of transistors T1 and T2 and the emitter of T5, and the collector of T3 and the emitter of T7.

Current supply 42' is comprised of transistors T6, T7 and current supply 41' is comprised of transistor T1. A diode D4, the cathode of which is connected to point M' which is connected to capacitor 45' and the anode of which is connected to ground, prevents capacitor 45', which is an electrolytic capacitance, from being reversely biased when the circuit is switched on.

Voltage at point M' is applied to an output circuit having a gain 1 and a high input impedance and a low output impedance in order to prevent the capacitor 45' from being discharged. This output circuit is comprised of two NPN transistors T8, T9 arranged as a differential amplifier. The emitters of transistors T8 and T9 are connected to a current source comprised of diode D5 and NPN transistor T10. The collector of transistor T10 is connected to the emitters of transistors T8 and T9, and its emitter is connected to the anode of diode D5 the cathode of which is connected to voltage $-V1$, through resistor R8. The base of transistor T10 is connected to the bases of transistors T1, T2 and T3.

Transistors T8 and T9 operate with the same collector current such as set by two transistors T11 and T12 which are of the PNP type. The emitters of T11 and T12 are connected to voltage +V1, their bases are connected to one another and their collectors are connected to the collectors of T9 and T8, respectively. The base and the collector of transistor T12 are connected to one another so that transistor T12 is diode-operated.

The collector of T12 is connected to the collector of transistor T8 through a compensation circuit comprised of two NPN transistors T13 and T14 and diode D6. The collector of transistor T13 is connected to the collector of transistor T12, its emitter is connected to the collector of transistor T14 and its base is connected to the emitter of transistor T4. The emitter of transistor 14 is connected to the collector of transistor T8. The bases of transistors T13 and T14 are connected to one another through diode D6 the anode of which is connected to the base of transistor T13, its cathode being connected to the base of transistor T14.

With this circuit, it is possible to discharge and charge the capacitor with substantially opposite currents. Indeed, there is a current $i_b$ which flows through lead 55 which is connected to the base of transistor T8 and, therefore, should there be no compensation circuit, the capacitor would be charged with $I-i_b$ and discharged with $-I-i_b$.

A current $2i_b$ is flowing through lead 56 which is connected to the respective bases of transistors T13 and T14; therefore, a current $2I+2i_b$ is flowing through leads 53 and 51, and the charge current will be $2I-I+-2i_b-i_b=I+i_b$ and the discharge current will be $-I-i_b$. Both charge and discharge currents will therefore be substantially opposite.

In addition, the output circuit includes an impedance multiplier comprised of NPN transistors T15 and T16 which are series-connected between voltages +V1 and −V1, the collector of transistor T15 being connected to voltage +V1 and its emitter being connected to the collector of transistor T16. The base of transistor T15 is connected to the collector of transistor T9 and the emitter of transistor T15 is connected to the base of transistor T9. The base of transistor T16 is connected to the base of transistor T10, and its emitter is connected to voltage −V1 through forward biased diode D7, and resistor R9. The voltage $V'_M$ utilized as a reference voltage is taken at the base of transistor T9, through resistor R10.

The circuit shown in FIG. 5 is given by way of an example, only and it is obvious that it can be implemented in different ways.

As shown in FIG. 2B, the circuits disclosed in reference to FIGS. 3, 4 and 5 add a ripple which results from the shape of voltage $V_M$, to the input signal. This ripple is tolerable in an analog-digital converter if its amplitude is lower than that of the least significant bit.

In some applications, the ripple can be a hindrance. Therefore, and with reference to FIGS. 6 and 7, a third embodiment according to this invention will be disclosed with which it will be possible to cancel the ripple added to the input signal. Furthermore, this embodiment has for another advantage that it can be used for compensating for the zero offset introduced by signal processing devices wherein $T_+$ is different from $T_-$ but wherein is no zero offset.

The circuit according to this third embodiment differs from the previous embodiments in that the times during which the current sources are switched on, are different.

In this circuit, the current sources are not switched on during all the duty cycle of the input signal but only during the instants when the sign of the output signal of the converter is different from the sign of the input signal.

FIG. 6 illustrates a way of generating the reference level at point M, as shown in FIG. 3.

Figure 6A:
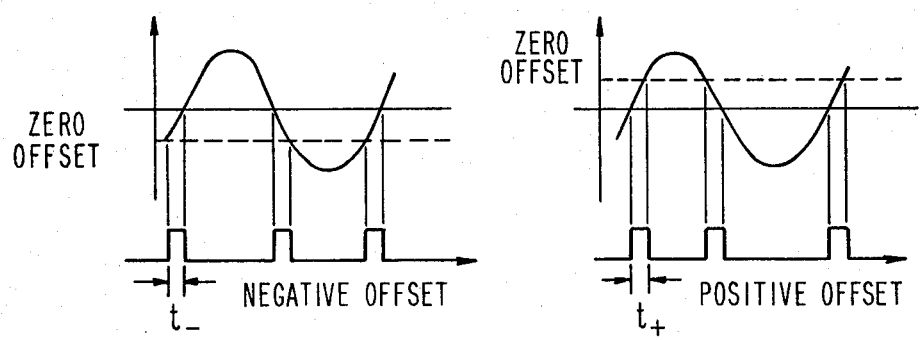
FIGS. 6a, 6b and 6c, are time diagrams which illustrate the times during which the corrections are made in conformity with a third embodiment of this invention when a negative zero offset and a positive zero offset are involved.

FIG. 6A illustrates times $t_+$ and $t_-$ during which the current sources are switched on in the case of a positive zero offset and a negative zero offset, respectively. As shown in the figure, these times correspond to the time periods elapsing between the crossing of the output signal at the real zero and at the offset zero.

Current sources 33 or 41 of the circuits shown in FIGS. 3 and 4 discharge the capacitor during times $t_{30}$ and current sources 34, or 42 and 41 charge the capacitor during time $t_-$ in order to generate the reference level at point M. For a zero offset in a given direction, there is only one current source switched on during times $t_-$ and $t_+$; outside these time periods, the current sources are switched off and the capacitor level remains constant.

Figure 6B:
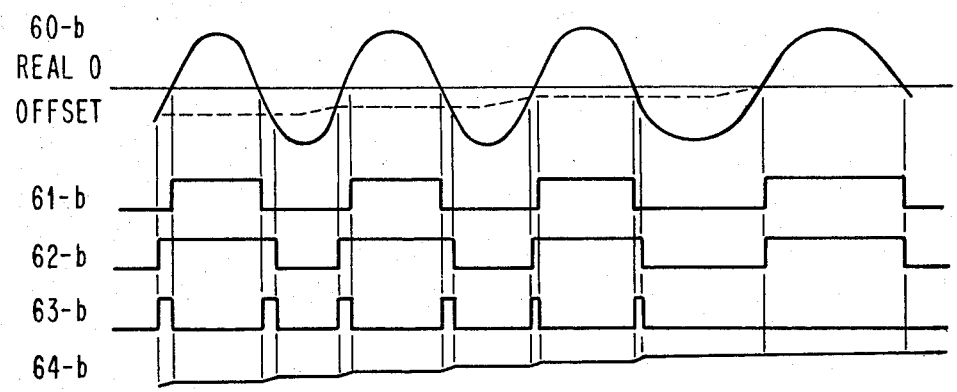
Figure 6C:
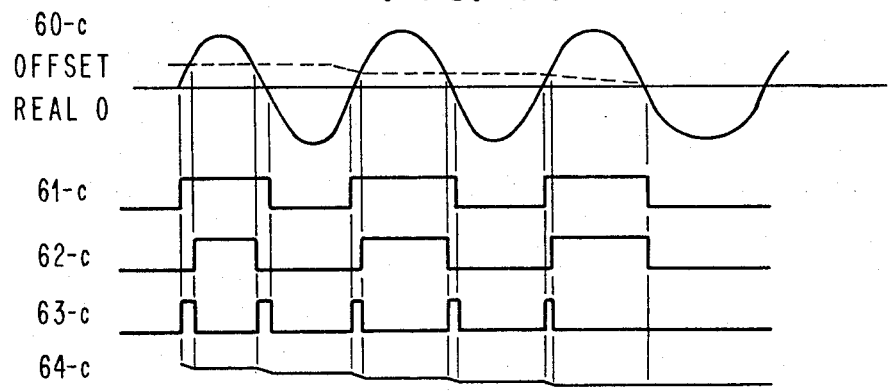

The reference levels generated for a negative zero offset and a positive zero offset of signal 60 are illustrated in FIGS. 6B and 6C. When a converter is concerned, the output signal is of the same sign as the input signal and it is representative of the coded value of the input signal. Therefore, signal 60 is representative of the input signal since the digital output of the signal is difficult to represent.

With reference to FIGS. 6B and 6C, signals 61-b and 61-c assume high levels when the output signal, which is representative of the input signal, is higher than the real zero. Signals 62-b and 62-c assume high levels when the input signal is higher than the offset zero. It can be deduced therefrom times $t_-$ and $t_+$ which are as shown by 63-b and 63-c, respectively. For a negative offset (FIG. 6B) the capacitor is charged during times $t_-$, and for a positive offset (FIG. 6C) it is discharged during times $t_+$. The voltage level $V_M$ at the capacitor terminals for a negative offset and a positive offset, is as shown by 64-b and 64-c, respectively.

According to this third embodiment, a control circuit must, therefore, be added to the circuits shown in FIG. 3 or 4, with which it will be possible to control the charge or the discharge of the capacitor during the previously defined appropriate times.

Figure 7:
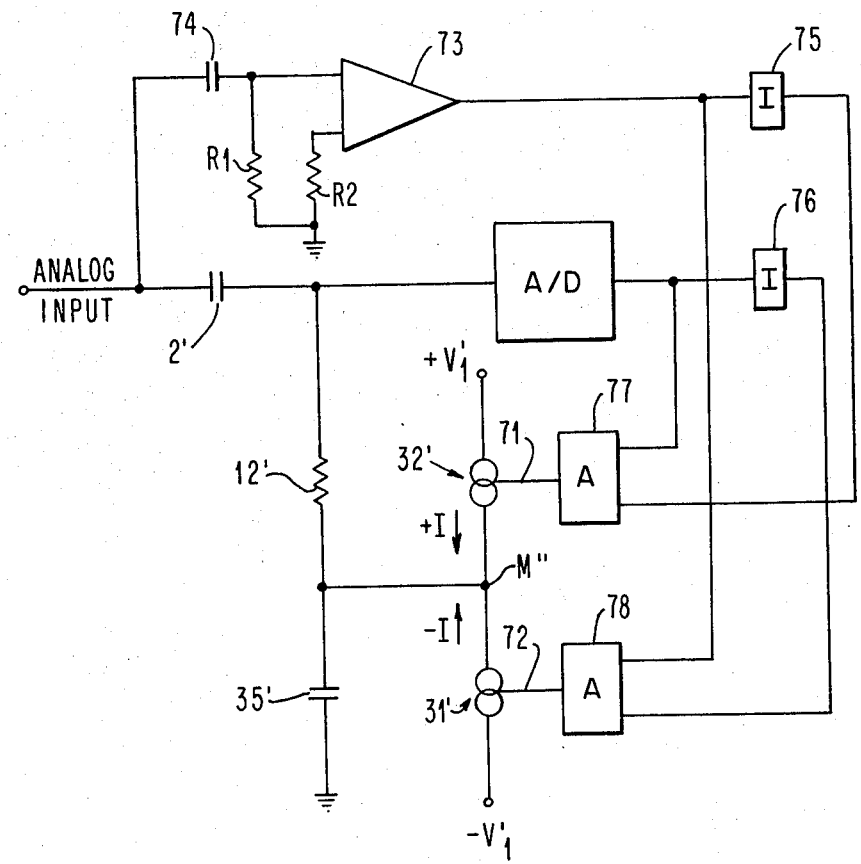
FIG. 7 is a third embodiment according to this invention.

It is obvious that these circuits will be different according to the implementations of this invention. FIG. 7 illustrates a control circuit for controlling the switching on of current sources 32 and 31 of FIG. 3. According to this embodiment, it is not necessary that the switching times of the current sources are substantially equal since there is only one current source that is operated when the offset has one specific direction.

In a converter, the information relative to the time periods during which the output signal is higher or lower than the offset zero, is given by the sign of the coded signal. In addition, when there is no offset, the sign of the output signal should be the same as that of the input signal. Therefore, it suffices to provide for a comparator for comparing the input signal with the offset zero in order to obtain the information about the time periods during which the output signal is higher or lower than the real zero.

The elements common to the circuits of FIGS. 1 and 3 and of FIG. 7 have the same reference numbers but are accompanied with a prime sign in FIG. 7.

The circuit of FIG. 7 is comprised of input capacitor 2' which receives the analog signal to be converted, and A/D converter, the structure of which is as shown in FIG. 1. The A/D converter includes a sample hold circuit, a comparator and a reference level generator. The input signal is referenced with respect to point M" to which capacitor 35' is connected. The compensation voltage $V_{M''}$ assuming either the shape 64-b or 64-c according to the offset sign, is generated at point M". The circuit includes two current sources 32' and 31' which supply currents $+I$ and $-I$, at point M", respectively when they are switched on by a signal assuming the shapes 64-b and 64-c on lines 71 and 72. respectively.

The circuit includes a control circuit for controlling the generation of signals 64-b and 64-c. This control circuit is formed of a logic circuit and comparator 73, one input of which receives the input signal, through a capacitor 74. Capacitor 74 has the same value as capacitor 2'. The comparator circuit also includes a resistor R1, its other input being connected to ground, through resistor R2. The output signal of comparator assumes the shape 61-b or 61-c, i.e., it is indicative of the real sign of the output signal of the converter since, when a converter is concerned, the signs of the input and output signal are the same. The information about the sign of the output signal 62-b or 62-c with respect to the offset zero, is given by the A/D converter.

The logic circuit, comprised of two inverters 75 and 76 and two AND circuits 77 and 78, supplies the control signals 63-b and 63-c on lines 71 and 72, respectively.

The inverters 75 and 76 are connected to the outputs of comparator 73 and of the A/D converter. AND circuit 77 receives the information relative to the sign with respect to the offset zero, at one of its inputs, its other input receiving the output of inverter 75. Therefore, it supplies signal 63-b at the output 71.

The AND circuit 78 receives the real sign information supplied by comparator 73 at once of its inputs, the other one receiving the output of inverter 76. Therefore, it supplies signal 63-c on its output line 72.

Therefore, the current source 32' is switched on when the signal 63-b assumes a high level; the reference signal at point M" assumes the shape represented by 64-c.

The above-disclosed invention applies to an analog-digital converter. In this implementation, the additional elements are a comparator and a logic circuit.

In the third embodiment according to this invention, the elements necessary for its implementation in a different analog device, are, of course, dependent on the function fulfilled by this device. But, however, the man skilled in the art will be able to easily adapt the control circuit disclosed with reference to FIG. 7 for controlling the generation of signals 63-b and 63-c, into any type of implementation.

It is clear that the preceding description has only been given by way of a non-limitative example, and that numerous alternatives may be considered without departing from the spirit and scope of this invention.

Having thus described by invention, what is claimed as new, and desired to be secured by Letters Patent is:

1. In an analog device having at least one input and one output and receiving an analog signal with a zero mean value, at said input and supplying at its output a signal having a determined relationship with the input signal, an improved compensation circuit for compensating for the zero offset level introduced into the output signal by the device, comprising:

means for providing a signal indicative of the sign of the output signal with respect to the real zero, generating means for generating a first control signal during the time-periods when the signs with respect to the offset zero and the real zero are different and when the offset zero crossing in the positive direction precedes the real zero crossing in the positive direction, generating means for generating a second control signal during the time periods when then signs with respect to the offset zero and the real zero are different and when the real zero crossing in the positive direction precedes the offset zero crossing in the positive direction, a storage capacitor having a first terminal M and a second terminal connected to a reference voltage, charging means for charging the capacitor with a current I during the times defined by the first control signal, discharging means for discharging the capacitor with a current $-I$ during the times defined by the second control signal, and means for adding the voltage generated at point M in response to the charge and discharge of said storing capacitor, to the input signal.

2. A circuit according to claim 1, wherein:
said charging means for charging the capacitor includes a current source $+I$ connected between a positive voltage supply and terminal M, and means for causing said current supply $+I$ to become conducting during the times defined by said first control signal.

3. A circuit according to claim 2, wherein:
said discharging means for discharging the capacitor includes a second source $-I$ connected between point M and a negative voltage supply, and means for causing the second current source to become conducting during the times defined by the second control signal.

4. A circuit according to claim 2, wherein:
the analog device is an analog-digital converter.

5. A circuit according to claim 1, wherein:
said discharging means for discharging the capacitor includes a second current source $-I$ connected between point M and a negative voltage supply, and means for causing the second current source to become conducting during the times defined by the second control signal.

6. A circuit according to claim 5, wherein:
the analog device is an analog-digital converter.

7. A circuit according to claim 1, wherein:
the analog device is an analog-digital converter.

8. a circuit according to claim 7, wherein:
said signal indicative of the sign of the signal with respect to the sign of the offset zero is given by the sign of the coded output signal and further including;

a comparator comparing the input signal with respect to the offset zero level in order to have information about the sign thereof with respect to the real zero, a logic circuit for generating the first and second control signals from the information about the two signs.

* * * * *